(12) United States Patent
Weiblen

(10) Patent No.: US 6,661,668 B2
(45) Date of Patent: Dec. 9, 2003

(54) HOUSING AND METHODS OF PRODUCING A HOUSING

(75) Inventor: Kurt Weiblen, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/031,814

(22) PCT Filed: Apr. 10, 2001

(86) PCT No.: PCT/DE01/01407
§ 371 (c)(1),
(2), (4) Date: May 31, 2002

(87) PCT Pub. No.: WO01/87028
PCT Pub. Date: Nov. 15, 2001

(65) Prior Publication Data
US 2002/0153155 A1 Oct. 24, 2002

(30) Foreign Application Priority Data

May 9, 2000 (DE) .......................................... 100 22 416

(51) Int. Cl.$^7$ ................................................ H05K 5/06
(52) U.S. Cl. ........................ 361/730; 361/800; 361/818; 361/816; 174/51; 257/99
(58) Field of Search ................................ 361/730, 752, 361/800, 801, 816, 818, 714, 724; 174/35 R, 52, 51; 455/387; 257/99

(56) References Cited

U.S. PATENT DOCUMENTS 5,845,803 A * 12/1998 Saito et al. .................. 220/378

FOREIGN PATENT DOCUMENTS

| DE | 26 52 262 | 5/1978 |
| DE | 41 21 828 | 1/1993 |
| DE | 196 26 084 | 1/1998 |
| EP | 0 028 547 | 5/1981 |
| EP | 0 724 380 | 7/1996 |

* cited by examiner

Primary Examiner—David Martin
Assistant Examiner—Hung Bui
(74) Attorney, Agent, or Firm—Kenyon & Kenyon

(57) ABSTRACT

A housing, in particular a housing for electronic components, which includes a housing part which is made of plastic and has at least one opening, and a lid part for closing off the opening. It is proposed that the lid part is produced as a metal punched part, the punched edge of the lid part having a punch ridge on a first side of the lid part and a punch indentation on a second side opposite the first side, and the lid part being pressed into the opening of the housing part via the second side so that the lid part comes to rest against assigned sections of the inner wall of the opening via at least two edge sections that are distributed around the perimeter of the lid part and bites into the assigned sections of the inner wall in a barb-like manner via the punch ridge.

15 Claims, 2 Drawing Sheets

HOUSING AND METHODS OF PRODUCING A HOUSING

FIELD OF THE INVENTION

The present invention relates to a housing and a method of producing a housing.

BACKGROUND INFORMATION

A housing of this kind and a method for producing it are known heretofore per, for example, German Published Patent Application No. 196 26 084. The housing for a pressure sensor chip described in that document has a housing base part made of plastic having an opening which, once the sensor component has been inserted, is closed off via a lid part that is embodied as a connector element. The lid part has a resilient projection which locks into a groove that is provided on the housing base part.

Furthermore, in the related art many different types of housing for electrical and/or electronic components having a lid part made of plastic or metal which is adhesively bonded to or clipped onto a housing made of plastic are known heretofore.

SUMMARY OF THE INVENTION

The housing according to the present invention has the advantage that the lid part is produced in a straightforward and very inexpensive manner as a punched component made of a metal sheet, and is attached to the plastic housing part in a straightforward manner so that it cannot be lost. The lid part has at its edge—which is produced via the punch process—a punch ridge on the first side and a punch indentation on a second side that is opposite the first side. Thanks to the rounded edge contour, the punch indentation on the second side of the lid part functions advantageously to facilitate sliding or insertion when the lid part is pressed into the opening of a housing part. The punch ridge, which is on the first side of the lid part opposite the punch indentation, advantageously bites into the inner wall of the opening in a barb-like manner, so that the lid part is fixed in place in the housing part so that it cannot be lost. Thus it is advantageous that there is no need for stop lugs, clip attachments or adhesive bonding attachment. The lid part may be given different contours via punching, and may be given different shapes via stamping or drawing. A minimum of space is required on the housing part to fix the lid part in place, as adhesive-bonding attachments, clip attachments or other attachment elements are not required.

In order to ensure that the lid part is reliably fixed in place in the opening of the housing part, the distance between at least two edge sections distributed around the perimeter of the lid part is slightly greater than the distance between the respective sections of the inner wall of the opening, so that the edge sections exert lateral pressure on the inner walls, and the sharp-edged punch ridge of the lid part bites reliably into the relatively soft inner walls, which are made of plastic.

Furthermore, it is advantageous if the housing wall that delimits the opening has elastically flexible areas having reduced wall thickness, into the inner sides of which the edge sections of the lid part having the punch ridge can bite in a barb-like manner. As a result, the load that needs to be applied when pressing in the lid part is reduced in an advantageous manner.

When the lid part is pressed in, it advantageously comes to rest on a shoulder that is provided on the inside of the housing of the housing part.

Furthermore it is advantageous if an adhesive or sealant which seals off the housing and reliably reduces penetration by moisture or harmful gases is applied all around the outer edge area of the first side of the lid part and to a part of the inner wall of the opening that extends beyond the first side of the lid part.

Furthermore, a method for producing a housing, in which a housing part made of plastic and having an opening is closed off by a lid part, and in which the lid part is produced by punching from a metal sheet, the edge of the lid part having a punch ridge on the first side of the lid part and a punch indentation on the second side opposite the first side, the lid part then being pressed into the opening of the housing part via the second side, the lid part thus coming to rest against the respective sections of the inner wall of the opening via at least two edge sections distributed around the perimeter of the lid part, and the punch ridge biting in there in a barb-like manner, is advantageous. The method may be carried out in a fully automated manner, and makes it feasible to close off a plastic housing in a straightforward manner so that the lid cannot be lost, no additional process steps being necessary.

DETAILED DESCRIPTION

Figure 1:
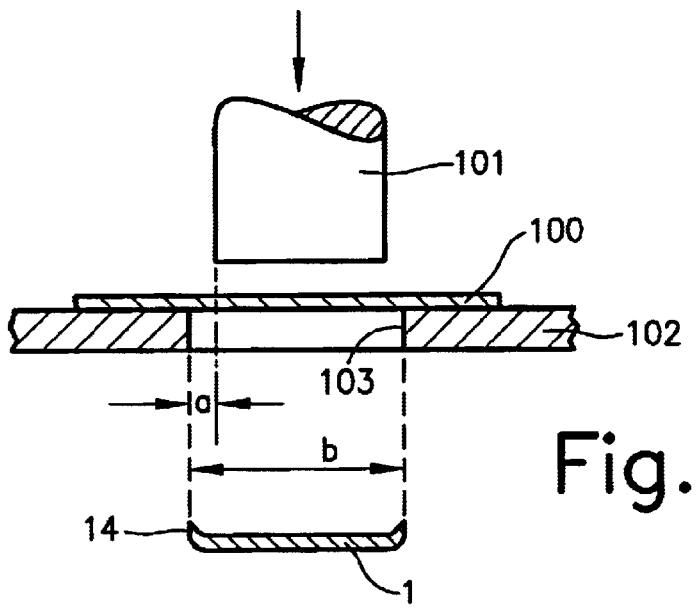
FIG. 1 shows a cross section through a device for producing the lid part during a the punch process.

In FIG. 1, a device for producing the lid part is shown. Metal sheet 100 is placed on base support 102, which has a preferably rectangular-shaped recess 103 having width b and a length that is not shown. Metal sheet 100, which is preferably made of stainless steel, covers recess 103. The metal sheet may also be made of aluminum or nickel or another suitable metal. Next, lid part 1 is punched out of metal sheet 100 using punch 101, punch 101 having smaller spatial dimensions than the width b and the length of recess 103, so that there is a small gap between the outer wall of the punch and the inner wall of recess 103. In the case of a metal sheet having a thickness of about 250 micrometers, gap width a should be approximately between 0.03 and 0.01 mm. In the case of a thicker metal sheet, the gap width may be greater. Punched lid part 1 has first side 10, second side 11, which is opposite first side 10, and edge 14 around the perimeter, this being created via the punch process. As can be seen most clearly in FIG. 2a and FIG. 2b, after the punch process described above has been carried out, punched edge 14 of lid part 1 has punch ridge 12 on first side 10 and punch indentation 13 on second side 11 opposite first side 10. The edge contour in the transition area between second side 11 and edge 14 is rounded thanks to punch indentation 13 and may therefore facilitate insertion when lid part 1 is pressed into the opening of housing part 2. Punch ridge 12 functions as a kind of barb via which lid part 1 can be fixed in place in inner wall 7 of an opening 4 of a housing 2, this inner wall being made of plastic and thus relatively flexible. The shape and size of punch ridge 12 and of punch indentation 13 opposite it are essentially defined by gap width a of the punch tool and the material of lid part 1.

Figure 2A:
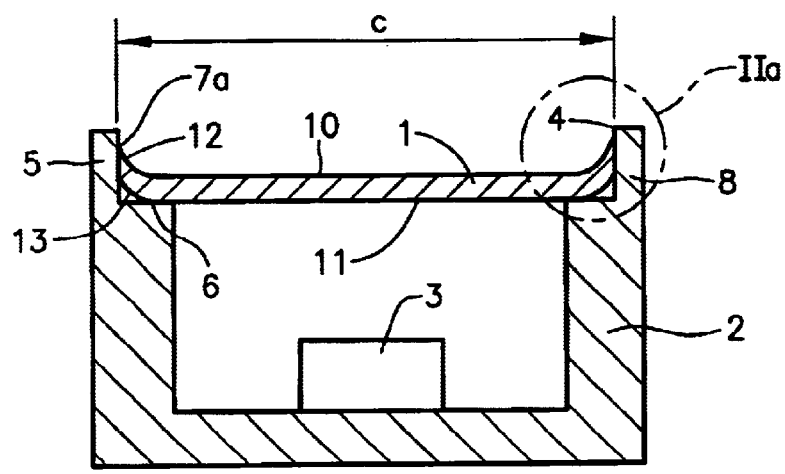
FIG. 2a shows a cross section through a first exemplary embodiment of the housing according to the present invention along the line I—I in FIG. 3.

The pot-shaped housing part shown in FIG. 2a is made of plastic and is preferably used to house an electronic component 3, in particular a semiconductor pressure sensor. The electrical connectors of sensor 3, which are not shown, pass outwards through the side walls or base of housing part 2. Housing part 2 has an opening 4 on its upper side. A step, via which shoulder 6 on which lid part 1 rests and via which surrounding wall 8—which delimits opening 4 and is collar-like—are formed, is provided in the part of inner wall 7 of housing part 2 that delimits opening 4. As wall 8 is, like housing part 2, made of plastic, the wall is somewhat elastically flexible. Although it is possible to embody the lid part and opening 4 so that they are, for example, circular, and to press the lid part into the opening so that the entire surrounding edge 14 comes to rest against inner side 7 of housing wall 8, this would mean that quite considerable force would have to be exerted, and in an unfavorable case this could result in deforming of lid part 1.

Figure 2B:
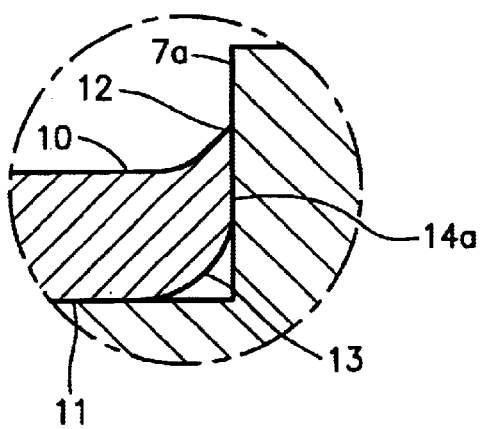
FIG. 2b shows part of FIG. 2a, enlarged.
Figure 3:
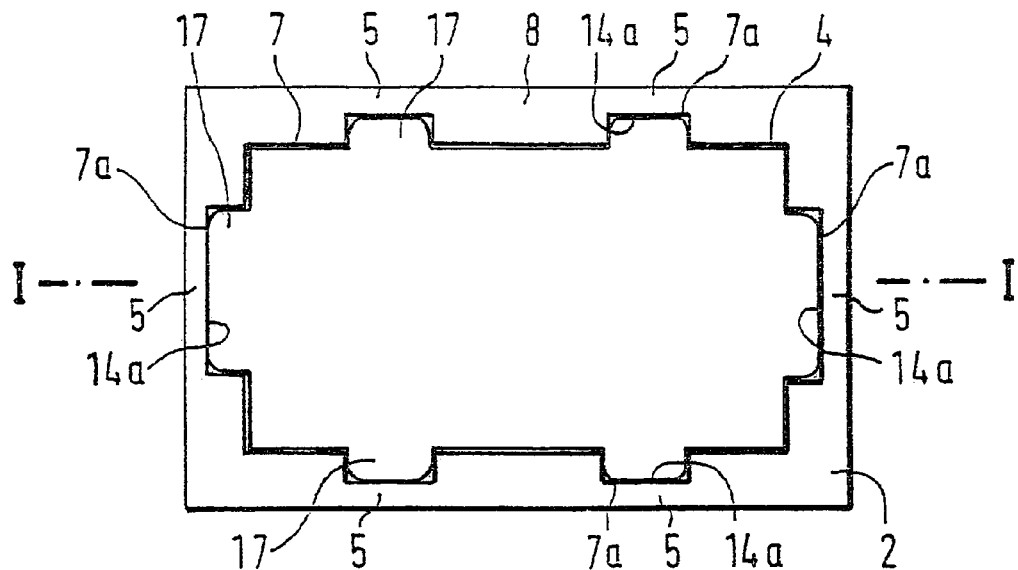
FIG. 3 shows a top view of the housing shown in FIG. 2a that is closed off using lid part 1.

Therefore, as is shown in FIG. 3, in an advantageous exemplary embodiment wall 8 has elastically flexible areas 5 having reduced wall thickness, these being formed by recesses in wall 8. Edge 14 of lid part 1 has a contour that largely matches the contour of inner wall 7 of housing wall 8 and has tongue-like sections 17 which protrude outwards and which, at their edge sections 14a, come to rest against elastically flexible areas 5 of housing wall 8, while the remaining edge sections of edge 14 are not in direct contact with inner wall 7 of housing 8 but rather are separated from it by a small gap. As a result, when it is pressed in, the lid part is pressed via just a few edge areas 14a against elastically flexible sections 7a of inner wall 7 of housing wall 8, which means the force required to press it in is reduced. In the boundary case there may be just two edge sections located opposite one another. In the case of all the exemplary embodiments, distance b between two edge sections 14a distributed around the perimeter of lid part 1 is always slightly greater than distance c between the assigned sections 7a of inner wall 7, so that when lid part 1 is pressed in the inner wall is bent outwards slightly. During pressing in, the punch indentation, which slides over the inner edges of housing wall sections 7a, advantageously facilitates insertion. As is shown in FIG. 2a and FIG. 2b, when it is pressed in the lid part comes to rest on shoulder 6 via second side 11. In the end position, punch ridge 12 bites into inner wall sections 7a in a barb-like manner so that lid part 1 is fixed in position in housing part 2 so that it cannot be lost.

Figure 4:
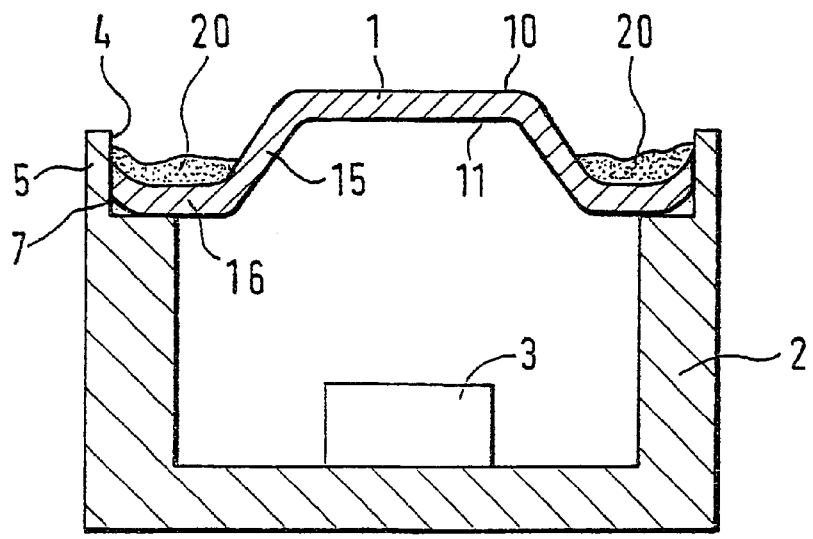
FIG. 4 shows a second exemplary embodiment of the housing according to the present invention.

In another exemplary embodiment, lid part 1 is in addition given a three-dimensional shape via stamping or drawing, e.g., a dish-shaped contour as shown in FIG. 4. In addition, it is also possible to apply a sealing adhesive or sealant, e.g., a silicon adhesive, to edge area 16 of first side 10 of lid part 1 and to a part of inner wall 7 of opening 4 that extends beyond first side 10.

What is claimed is:

1. A housing, comprising:
    a housing part made of plastic and including at least one opening; and
    a lid part produced as a punched metal part and for closing off the at least one opening, wherein:
        a punched edge of the lid part includes a punch ridge on a first side of the lid part and a punch indentation on a second side opposite the first side, and
        the lid part is pressed into the at least one opening of the housing part via the second side so that the lid part comes to rest against corresponding sections of an inner wall of the at least one opening via at least two edge sections that are distributed around a perimeter of the lid part and bites into the corresponding sections of the inner wall in a barb-like manner via the punch ridge.

2. The housing according to claim 1, wherein:
    the housing is for an electronic component.

3. The housing according to claim 1, wherein:
    a distance between the at least two edge sections is slightly greater than a distance between the corresponding sections of the inner wall of the at least one opening.

4. The housing according to claim 1, further comprising:
    a housing wall that delimits the at least one opening and includes elastically flexible areas having reduced wall thickness into the corresponding sections of which the at least two edge sections of the lid part bite in a barb-like manner via the punch ridge.

5. The housing according to claim 1, wherein:
    a housing inner side of the housing part includes a shoulder on which the lid part that has been pressed in rests.

6. The housing according to claim 1, wherein:
    one of a sealant and a sealing adhesive is applied around an outer edge area of the first side of the lid part and to a part of the inner wall of the at least one opening that extends beyond the first side of the lid part.

7. The housing according to claim 1, wherein:
    an electronic component is inserted into the housing.

8. The housing according to claim 7, wherein:
    the electronic component includes a semiconductor sensor element.

9. The housing according to claim 1, wherein: the lid part includes a dish-shaped contour.

10. A method of producing a housing in which a housing part made of plastic and including an opening is closed off via a lid part, the method comprising the steps of:
    producing the lid part via a punching operation performed on a metal sheet, an edge of the lid part including a punch ridge on a first side of the lid part and a punch indentation on a second side opposite the first side; and
    subsequently pressing the lid part into the opening of the housing part via the second side, the lid part coming to rest against assigned sections of an inner wall of the opening via at least two edge sections that are distributed around a perimeter of the lid part and biting into the assigned sections in a barb-like manner via the punch ridge.

11. The method according to claim 10, wherein:
    the housing is for an electronic component.

12. The housing according to claim 10, wherein:
    a distance between the at least two edge sections is slightly greater than a distance between the assigned sections of the inner wall of the opening.

13. The method according to claim 10, further comprising the step of:
    providing in a housing wall that delimits the opening elastically flexible areas having reduced wall thickness, wherein:
        the at least two edge sections bite into the assigned sections bite in a barb-like manner via the punch ridge when the pressing in performed.

14. The method according to claim 10, further comprising the step of:

after the lid part has been pressed in, applying a sealing adhesive around an edge area of the first side of the lid part and to a part of the inner wall of the opening that extends beyond the first side of the lid part.

15. The housing according to claim 10, further comprising: providing a dish-shaped contour to the lid part.

* * * * *